(12) United States Patent
Franck et al.

(10) Patent No.: US 10,456,330 B2
(45) Date of Patent: Oct. 29, 2019

(54) CAPSULE FILLING MACHINE

(71) Applicant: Robert Bosch GmbH, Stuttgart (DE)

(72) Inventors: Thomas Franck, Lorch-Weitmars (DE); Werner Runft, Winnenden (DE); Jens Schlipf, Freiberg (DE)

(73) Assignee: Robert Bosch GmbH, Stuttgart (DE)

( * ) Notice: Subject to any disclaimer, the term of this patent is extended or adjusted under 35 U.S.C. 154(b) by 348 days.

(21) Appl. No.: 15/514,557

(22) PCT Filed: Jul. 31, 2015

(86) PCT No.: PCT/EP2015/067622
§ 371 (c)(1),
(2) Date: Mar. 27, 2017

(87) PCT Pub. No.: WO2016/045838
PCT Pub. Date: Mar. 31, 2016

(65) Prior Publication Data
US 2017/0216147 A1 Aug. 3, 2017

(30) Foreign Application Priority Data

Sep. 26, 2014 (DE) .................. 10 2014 219 576

(51) Int. Cl.
| | |
|---|---|
| *A61J 3/07* | (2006.01) |
| *G01B 7/14* | (2006.01) |
| *B65B 69/00* | (2006.01) |
| *G01R 27/26* | (2006.01) |

(52) U.S. Cl.
CPC .............. *A61J 3/074* (2013.01); *B65B 69/00* (2013.01); *G01B 7/14* (2013.01); *G01R 27/2605* (2013.01)

(58) Field of Classification Search
CPC .. A61J 3/074; A61J 3/075; B65B 3/28; B65B 1/32; B65B 35/08; B65B 57/02; A61K 9/4808; A61K 9/4833; B25J 13/086
USPC ....... 424/453, 454; 53/291, 292, 900, 67, 69
See application file for complete search history.

(56) References Cited

U.S. PATENT DOCUMENTS

| | | | | |
|---|---|---|---|---|
| 4,089,152 A | * | 5/1978 | Zanasi | A61J 3/074 53/281 |
| 4,163,354 A | * | 8/1979 | Austin | A61J 3/074 53/282 |
| 4,403,461 A | * | 9/1983 | Goutard | A61J 3/072 53/282 |

(Continued)

FOREIGN PATENT DOCUMENTS

EP  2389919  11/2011

OTHER PUBLICATIONS

International Search Report for Application No. PCT/EP2015/067622 dated Oct. 19, 2015 (English Translation, 2 pages).

*Primary Examiner* — Stephen F. Gerrity
*Assistant Examiner* — Joshua G Kotis
(74) *Attorney, Agent, or Firm* — Michael Best & Friedrich LLP

(57) ABSTRACT

The present invention relates to a capsule filling machine for filling a capsule (20), which comprises an upper capsule part (21) and a lower capsule part (22). Said capsule filling machine comprises a plurality of separate stations for handling the capsules (20) and a capsule separation device (30) and a capsule presence device (40), the capsule separation device (30) and the capsule presence device (40) being integrated into a common station (2).

14 Claims, 5 Drawing Sheets

(56) References Cited

U.S. PATENT DOCUMENTS

| | | | | |
|---|---|---|---|---|
| 4,662,668 | A | * | 5/1987 | Hufford .................. B25J 13/086 |
| | | | | 294/185 |
| 4,731,979 | A | * | 3/1988 | Yamamoto .............. A61J 3/074 |
| | | | | 53/281 |
| 4,866,906 | A | * | 9/1989 | Tayebi .................... A61J 3/072 |
| | | | | 53/282 |
| 4,964,262 | A | | 10/1990 | Moser et al. |
| 5,966,910 | A | * | 10/1999 | Ribani .................... A61J 3/074 |
| | | | | 221/173 |
| 6,367,228 | B1 | * | 4/2002 | Wurst ..................... A61J 3/074 |
| | | | | 53/281 |
| 6,499,279 | B1 | | 12/2002 | Yamamoto et al. |
| 7,082,738 | B2 | * | 8/2006 | Konishi .................. A61J 3/072 |
| | | | | 53/281 |
| 7,669,388 | B2 | * | 3/2010 | Moodley ................. A61J 3/071 |
| | | | | 53/116 |
| 8,627,640 | B2 | * | 1/2014 | Ansaloni ................. A61J 3/074 |
| | | | | 53/454 |
| 2008/0127609 | A1 | * | 6/2008 | Tagliavini ............... A61J 3/074 |
| | | | | 53/53 |
| 2008/0134629 | A1 | | 6/2008 | Schmied et al. |
| 2008/0219803 | A1 | | 9/2008 | Runft et al. |
| 2014/0311104 | A1 | * | 10/2014 | Gamberini ............... B65B 1/06 |
| | | | | 53/558 |

* cited by examiner

CAPSULE FILLING MACHINE

BACKGROUND OF THE INVENTION

The present invention relates to a capsule filling machine, in particular for the pharmaceutical industry, which fills a capsule comprising an upper capsule part and a lower capsule part.

Capsule filling machines are known from the prior art in different configurations. The European patent application EP 2 389 919 A2 features, for example, a capsule filling machine, in which a capsule on a conveying wheel is filled at a plurality of stations. In so doing, further operations, such as opening the capsules, weighing the capsules, etc. are performed. This capsule filling machine has basically proven its worth; however, the need often arises on the market that additional handling stations be arranged on such conveying wheels. Due to the desired compactness of the capsule filling machine, the number of available positions for stations is however limited. In the pharmaceutical industry, increased requirements with regard to a process control furthermore result here, so that a control has to be performed a number of times on the conveying wheel, whereby the freely selectable number of available stations is further reduced. It is, however, also frequently the case that the capsules must be filled multiple times, wherein a separate station is required for each filling because, for example, different products have to be mixed in the case of multiple fillings.

SUMMARY OF THE INVENTION

The capsule filling machine according to the invention has in contrast the advantage that a number of available positions for stations can be increased. This is achieved according to the invention by virtue of the fact that at least two handling steps are brought together at a common work station. As a result, at least one position for a station opens up, which can be used for other handling steps. According to the invention, a capsule separation device, which separates the capsules into an upper capsule part and a lower capsule part, and a capsule presence device, which checks whether a capsule has even been correctly accommodated in a receptacle or something similar, are integrated at a common station. As a result, the compactness of the capsule filling machine can be further improved.

The capsule separation device preferably comprises an upper capsule part receptacle, a lower capsule part receptacle as well as a vacuum generator. The vacuum generator generates a negative pressure or a vacuum, which communicates with the lower capsule part. As a result, the lower capsule part can be separated from the upper capsule part because the upper capsule parts are usually only placed on the lower capsule parts. The upper capsule part is thereby held in the upper capsule part receptacle.

In a further preferred manner, the capsule presence device comprises a sensor for detecting a presence of the capsule. In a particularly preferred manner, the sensor thereby detects whether a lower capsule part is present. This is important for the reason that the lower capsule parts are filled from above after the separation process from the upper part of the capsule. If no lower capsule part is present, the filling would fall into the machine and lead to considerable contamination and adverse effects. Furthermore, costs result for the lost product.

In order to achieve a particularly compact construction, the capsule presence device is preferably disposed below the capsule separation device. In a particularly preferred manner, the capsule presence device is disposed below the lower capsule part.

In a further preferred manner, the capsule separation device comprises a separating pin, which is disposed beneath the lower capsule part receptacle.

In a particularly preferred manner, the separating pin can be moved linearly. Hence, a reliable separation process between upper capsule part and lower capsule part is made possible.

According to a further preferred embodiment of the invention, the sensor for detecting a presence of the capsule is a capacitive sensor. In a particularly preferable manner, the capacitive sensor is disposed at a free end of the hollow separating pin, which end is oriented towards the lower capsule part receptacle. The capacitive sensor is in this case preferably a capacitive proximity sensor.

In a further preferred manner, the capsule filling machine comprises a rotary plate, wherein the plurality of separate stations is disposed along the circumference of the rotary plate. In a particularly preferred manner, provision is thereby made for twelve stations.

BRIEF DESCRIPTION OF THE DRAWINGS

Exemplary embodiments of the invention are described below in detail with reference to the accompanying drawings. In the drawings.

DETAILED DESCRIPTION

A capsule filling machine 1 according to a preferred exemplary embodiment of the invention is described below in detail with reference to FIGS. 1 to 5.

Figure 1:
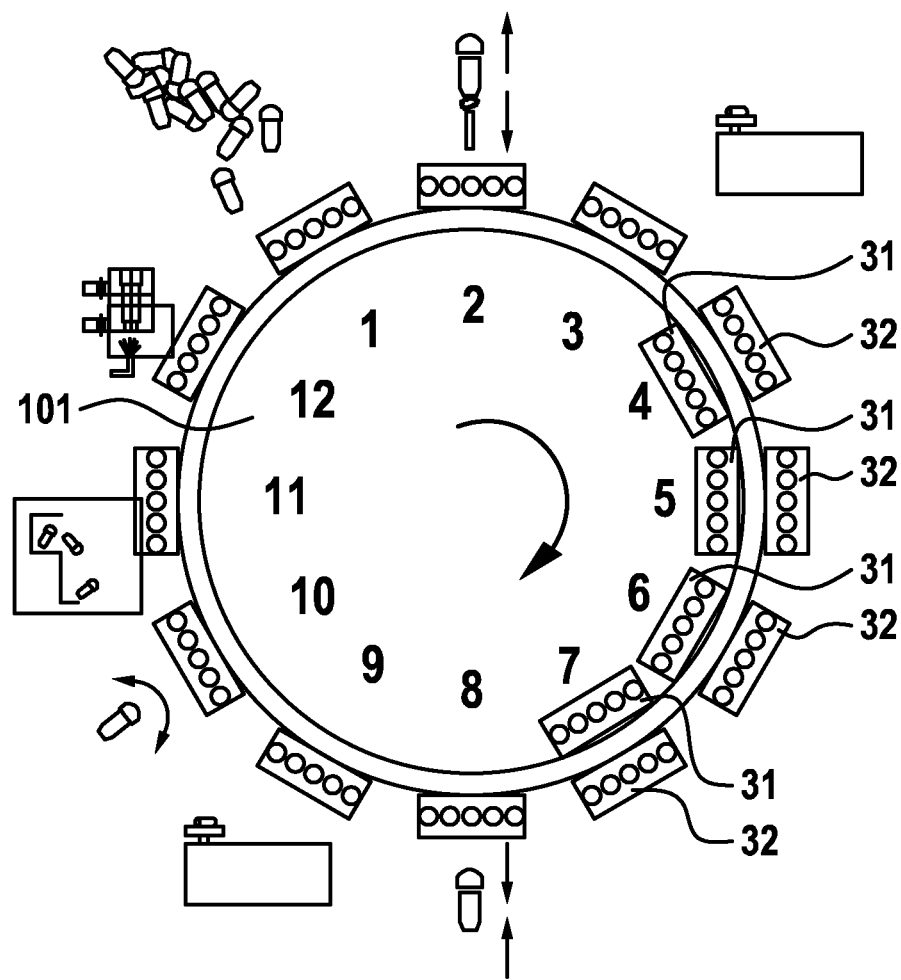
FIG. 1 shows a schematic top view of a capsule filling machine according to a preferred exemplary embodiment of the invention.

As can be seen from FIG. 1, the capsule filling machine 100 comprises a rotating rotary plate 101, on the circumference of which twelve stations are disposed, which are denoted by the numbers 1 to 12. The capsules are delivered to station 1 and separated at station 2, wherein the upper capsule part is separated from the lower capsule part. Furthermore, a presence check of the capsules is performed at station 2. As can be seen from FIG. 1, the capsules are disposed in the capsule receptacles 103, which is described later in detail. In a preferred manner, separation is performed at the station, whereat delivery is also made. Separation can, however, also be performed later.

At station 3, the empty unseparated capsule is weighed and the upper capsule part is separated from the lower capsule part upon being reinserted and checked for presence, so that the lower capsule part is open to the top in order to carry out a filling process.

The filling process is then carried out at stations 4, 5, 6 and 7, wherein in each case, e.g., a different bulk material or different filling quantities of the same bulk material is filled at each station.

The capsule halves are closed again at station 8 and weighed once again at station 9. In so doing, it is determined at station 9 whether the filling of the capsules is sufficient, which is particularly important for drugs.

Station 10 is a bad capsule elimination station, whereat damaged capsules or capsules that have not been correctly filled are, e.g., removed. At station 11, the capsules that have not been correctly filled are thrown out of the capsule filling machine, and station 12 is a cleaning station prior to new, empty capsules again being received at station 1.

According to the invention, a combined capsule separation and capsule presence station is provided at the stations 1 and 2 or at station 3. In this case, two functions are combined, namely the separation of the capsules into the upper capsule part and the lower capsule part as well as a presence control at one station. In FIGS. 2 to 5, the functionality of the combined station 2 is depicted.

Figure 2:
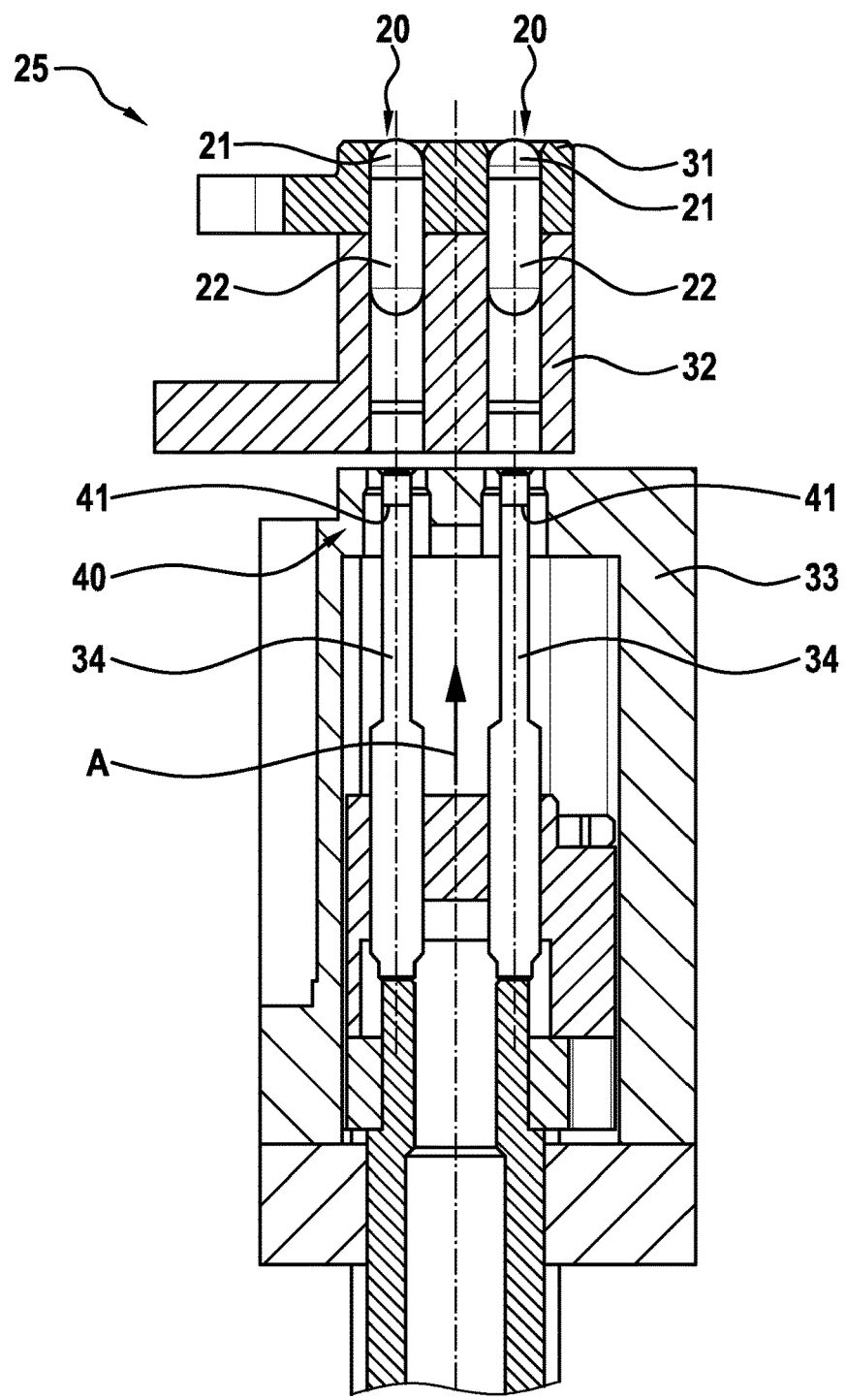
FIG. 2 shows a schematic cross-sectional view of a combined capsule separation and capsule presence station in an initial state.

FIG. 2 shows the initial state of the combined capsule separation and capsule presence station 25. The capsules are still closed, i.e. the upper capsule part 21 is placed on the lower capsule part. The upper capsule part 21 is thereby held in the upper capsule part receptacle 31. The lower capsule part 22 is accommodated in a lower capsule part receptacle 32.

As can be seen in FIG. 2, the lower capsule part 22 is also still partially disposed in the upper capsule part receptacle 31. In a first step, a vacuum is generated by means of the vacuum generator 33. The capsule separation device further comprises another separating pin 34, which comprises a capacitive sensor 41. The separating pin 34 can be move linearly, which is implemented by means of a drive that is not shown. As can be seen in FIG. 2, the separating pin 34 is thereby moved linearly in the direction of arrow A towards the capsule receptacle.

Figure 3:
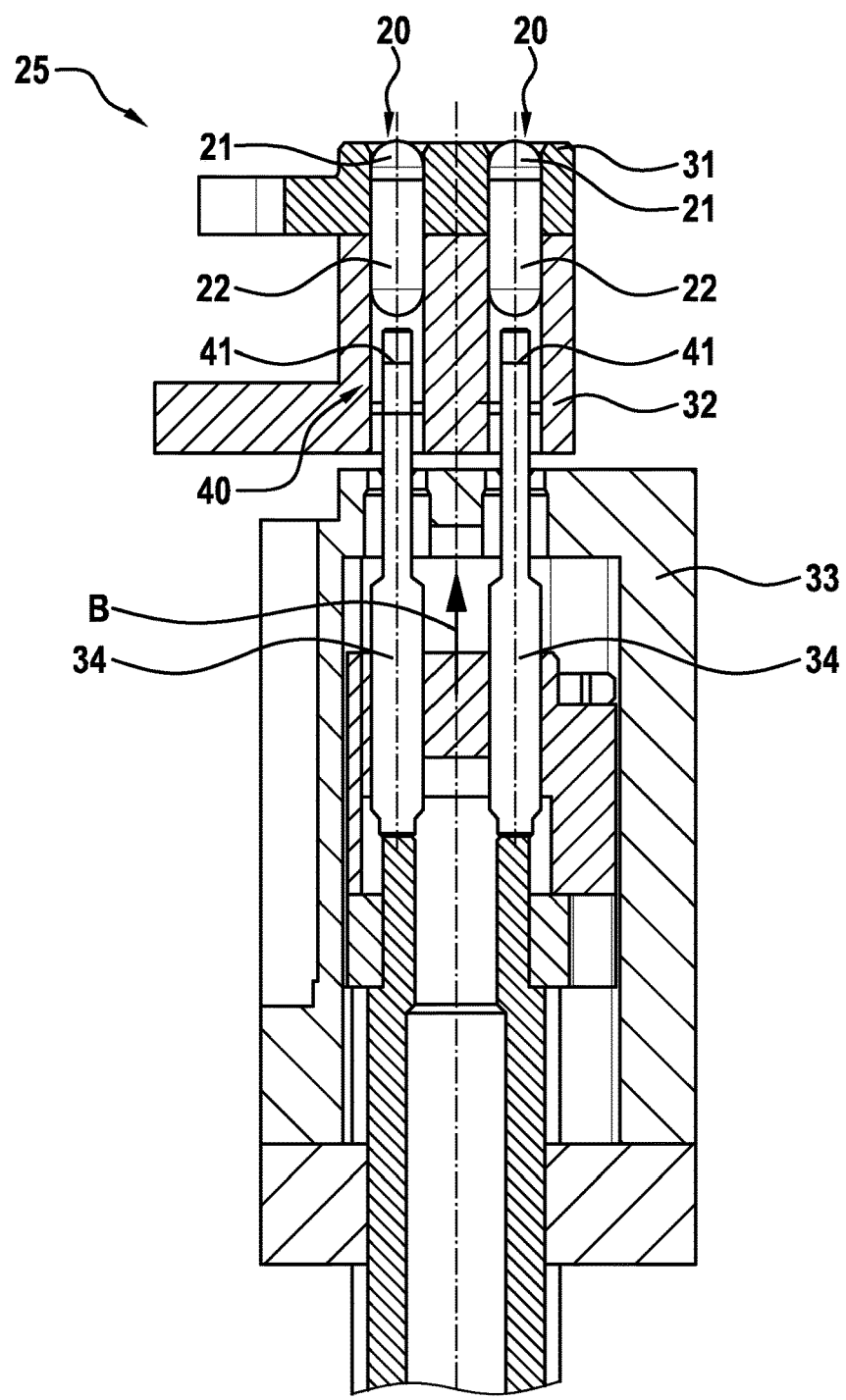
FIG. 3 shows a schematic cross-sectional view of the station of FIG. 2 in a pickup position of the lower capsule part.

In FIG. 3, the vacuum generator 33 is set onto the lower capsule part receptacle 32 so that the vacuum is also present in the region beneath the lower capsule part 22. The separating pin 34 is moved further linearly in the direction of the arrow B until said separating pin 34 comes in contact with the lower capsule part 22.

Provision is furthermore made for a capsule presence device 40, which comprises a capacitive sensor 41. The capacitive sensor 41 is at a free end of the separating pin 34, which is disposed so as to be oriented towards the lower part 22. As soon as the separating pin 34 touches the lower capsule part 22, the capacitive sensor captures this touch so that it can be ensured that a lower capsule part is disposed in the lower capsule part receptacle 32.

Figure 4:
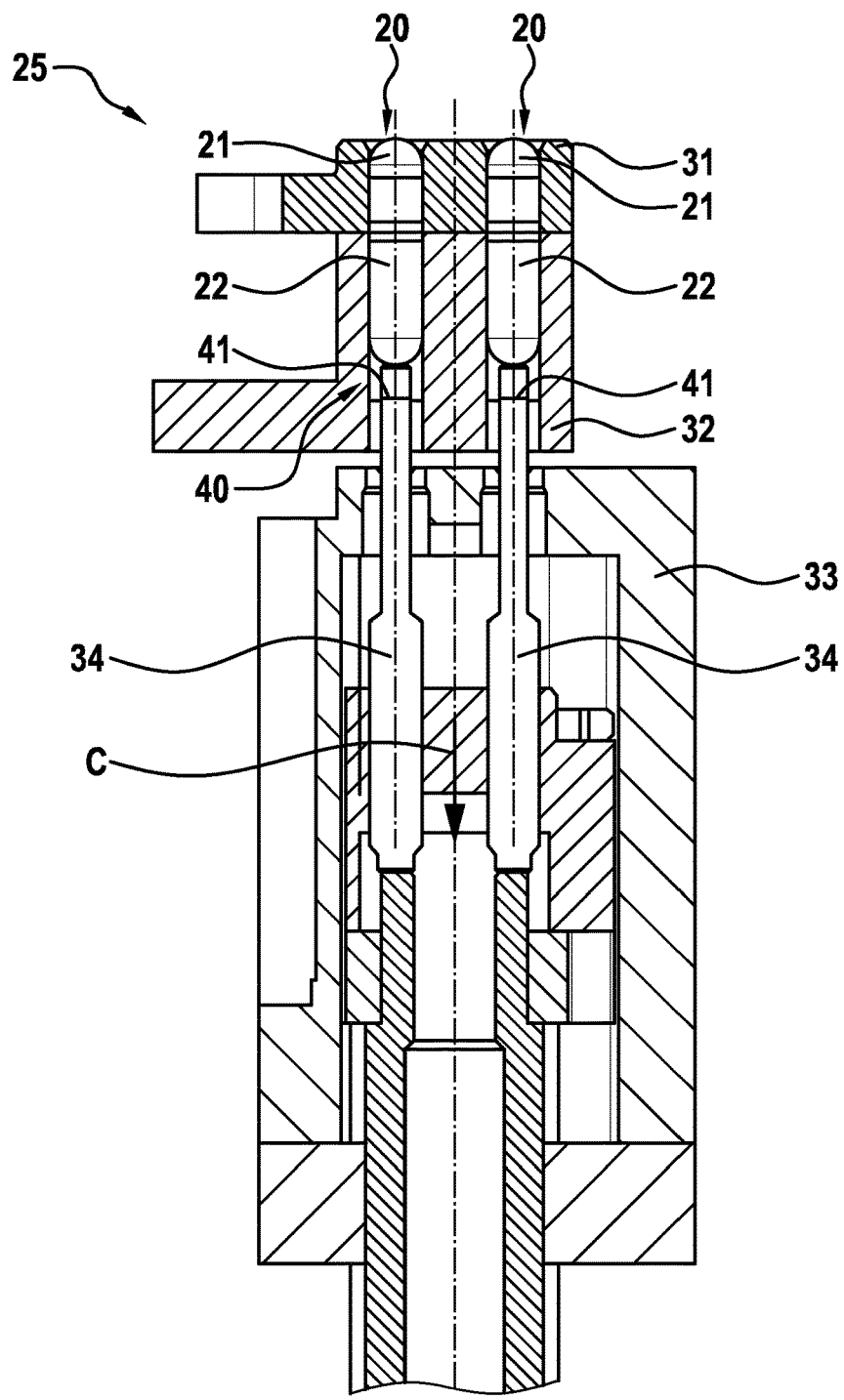
FIG. 4 shows a schematic cross-sectional view of the station of FIG. 2 in a separation operation position of upper capsule part and lower capsule part as well as a detection position of the lower capsule part.

The vacuum generated by means of the vacuum generator 33 prevails in the hollow space below the lower capsule part 22. As a result, the lower capsule part 22 is suctioned; thus enabling the lower capsule part 22 to release from the upper capsule part 21. This is indicated in FIG. 4 by the arrow C. The upper capsule part 21 is then held fixedly in the upper capsule part receptacle 31.

FIG. 4 clearly shows the state at which the lower capsule part 22 is separated from the upper capsule part 21.

Figure 5:
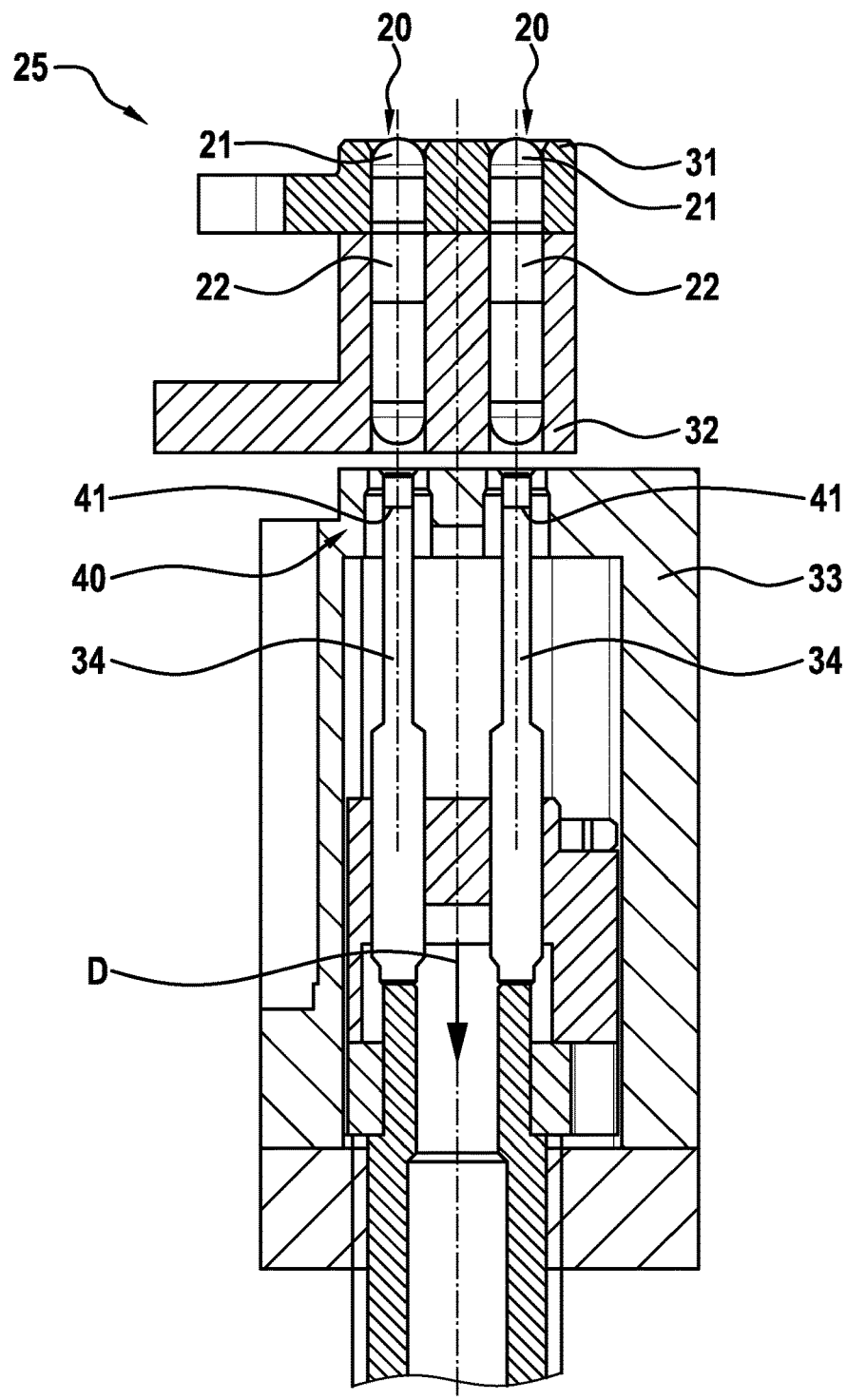
FIG. 5 shows a schematic cross-sectional view of the station of FIG. 2 after a separation operation of upper capsule part and lower capsule part is completed.

As can be seen in FIG. 5, the lower capsule part 22 still moves a short distance downwards; thus enabling a reliable separation between the lower capsule part and the upper capsule part to take place. The vacuum generator is subsequently removed from the lower capsule part receptacle 32 and the separating pin 34 is further retracted in the direction of arrow D further into the vacuum generator 33.

The unseparated capsule is initially weighed at station 3 and separated after the reinsertion, and the lower capsule part is checked for presence. The lower capsule part is filled with different products at stations 4 to 7. At station 4, the upper capsule part receptacle 31 is separated from the lower capsule part receptacle 32 in order to facilitate a simple filling of the lower capsule part.

It should be noted that respectively two capsules 20 as well as two separating pins 34 are depicted in FIGS. 2 to 5. A multiplicity of capsules, preferably in a two row arrangement, are normally provided in a capsule receptacle. Accordingly, the required number of separating pins is also then to be provided.

Hence, a function of the capsule separation and a function of the capsule presence check can be integrated into a common station according to the invention. The capsule presence station is in this case integrated into the capsule separation station. In so doing, a very compact construction results, which, particularly in the radial direction of the rotary plate, does not require any additional installation space. The capsule presence device 40 is integrated here into the separating pin 34; thus enabling the presence of a lower capsule part to be simply and reliably detected.

The sensors 41 are preferably capacitive proximity sensors. Other types of sensors can, however, be used.

In addition, the recognition of a lower capsule part that is not present can also be used to point out that a targeted non-filling of the absent lower capsule part takes place at the subsequent stations. As a result, it is particularly possible for the continuous clock frequency of the capsule filling machine to be held intact.

It should be further noted that lower capsule part sampling can also exclusively be used instead of the previously depicted double functionality of separating the capsules and detecting the lower capsule parts at this station. To this end, the lower capsule parts 22 are already situated in the lower capsule part receptacle 32 and are only briefly touched by the separating pins 34 in order to check for presence.

What is claimed is:

1. A capsule filling machine for filling capsules (20), the capsules each having an upper capsule part (21) and a lower capsule part (22), said capsule filling machine comprising:
   a plurality of separate stations for handling the capsules (20), and
   a capsule separation device (30) and a capsule presence device (40),
   the capsule separation device (30) and the capsule presence device (40) being located together at one of the stations (2, 25);
   wherein the capsule separation device (30) includes an upper capsule part receptacle (31), a lower capsule part receptacle (32), a vacuum generator (33) connected to the lower capsule part receptacle (32), and a separating pin (34) disposed below the lower capsule part receptacle (32);
   wherein the capsule presence device (40) includes a sensor (41) for detecting a presence of a capsule in the lower capsule part receptacle (32), wherein the sensor (41) is disposed at an end of the separating pin (34) that is oriented toward the lower capsule part receptacle (32), wherein the separating pin (34) and the sensor (41) are configured to be placed in proximity to the lower capsule part (22) prior to use of the vacuum generator (33), and are configured to be retracted away from the lower capsule part (22) after the vacuum generator (33) has generated a vacuum to pull the lower capsule part (22) away from the upper capsule part (21).

2. The capsule filling machine according to claim 1, characterized in that the sensor (41) is a capacitive sensor.

3. The capsule filling machine according to claim 1, characterized in that the separating pin (34) is configured to move linearly.

4. The capsule filling machine according to claim 1, further comprising a rotary plate (101), wherein the plurality of stations are disposed along a circumference of the rotary plate (101).

5. The capsule filling machine according to claim 4, characterized in that the separating pin is configured to be moved linearly relative to the lower capsule part receptacle (32).

6. The capsule filling machine according to claim 5, characterized in that the sensor (41) is a capacitive proximity sensor.

7. The capsule filling machine according to claim 1, wherein the upper capsule part (21) of one of the capsules (20) is configured to be disposed within the upper capsule part receptacle (31) and the lower capsule part (22) of the one of the capsules (20) is configured to be disposed in the lower capsule part receptacle (32) prior to activation of the vacuum generator (33).

8. The capsule filling machine according to claim 7, wherein the lower capsule part receptacle (32) is disposed between the vacuum generator (33) and the upper capsule part receptacle (31).

9. The capsule filling machine according to claim 7, wherein the separating pin (34) is positioned such that the sensor (41) is disposed at an end of the vacuum generator (33) prior to activation of the vacuum generator (33).

10. The capsule filling machine according to claim 9, wherein the separating pin (34) is configured to be driven linearly such that the sensor (41) is moved out of the vacuum generator (33) and into the lower capsule part receptacle (32) so as to detect the lower capsule part (21).

11. The capsule filling machine according to claim 7, wherein the lower capsule part (22) of the one of the capsules (20) is configured to be disposed partially in both the lower capsule part receptacle (32) as well as the upper capsule part receptacle (31) prior to activation of the vacuum generator (33), and is configured to be disposed entirely within the lower capsule part receptacle (32) upon activation of the vacuum generator (33).

12. A method of operating a capsule filling machine of claim 1, the method comprising:
providing the capsule filling machine of claim 1;
positioning one of the capsules such that the upper capsule part (21) is disposed in the upper capsule part receptacle (31) and the lower capsule part (22) is disposed in the lower capsule part receptacle (32);
linearly moving the separating pin (34) until the sensor (41) is moved into the lower capsule part receptacle (32) and the lower capsule part (22) is detected;
activating the vacuum generator (33) to pull the lower capsule part (22) linearly away from the upper capsule part (21); and
after activating the vacuum generator, retracting the separating pin (34) away from the lower capsule part (22).

13. The method of claim 12, wherein the separating pin (34) is positioned such that the sensor (41) is disposed at an end of the vacuum generator (33) prior to activating the vacuum generator (33).

14. The method of claim 12, wherein the lower capsule part (22) of the one of the capsules (20) is disposed partially in both the lower capsule part receptacle (32) as well as the upper capsule part receptacle (31) prior to activation of the vacuum generator (33), and is disposed entirely within the lower capsule part receptacle (32) after activating the vacuum generator (33).

* * * * *